(12) United States Patent
Hoshi et al.

(10) Patent No.: US 9,997,603 B2
(45) Date of Patent: Jun. 12, 2018

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventors: Yasuyuki Hoshi, Matsumoto (JP); Yuichi Harada, Matsumoto (JP); Takashi Shiigi, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days. days.

(21) Appl. No.: 15/686,662

(22) Filed: Aug. 25, 2017

(65) Prior Publication Data

US 2017/0352733 A1    Dec. 7, 2017

Related U.S. Application Data

(63) Continuation of application No. PCT/JP2016/073367, filed on Aug. 8, 2016.

(30) Foreign Application Priority Data

Sep. 17, 2015 (JP) .................. 2015-184249

(51) Int. Cl.
*H01L 29/40* (2006.01)
*H01L 29/16* (2006.01)
(Continued)

(52) U.S. Cl.
CPC ........ *H01L 29/408* (2013.01); *H01L 21/0465* (2013.01); *H01L 29/1095* (2013.01);
(Continued)

(58) Field of Classification Search
CPC .............. H01L 29/408; H01L 29/1608; H01L 21/0465; H01L 29/66068; H01L 29/7811; H01L 29/1095
See application file for complete search history.

(56) References Cited

U.S. PATENT DOCUMENTS 6,054,752 A * 4/2000 Hara .................... H01L 29/0611
257/629
9,419,133 B2 * 8/2016 Kinoshita ............. H01L 29/872
(Continued)

FOREIGN PATENT DOCUMENTS

JP     S62-60236 A      3/1987
JP     2002-334993 A    11/2002
(Continued)

OTHER PUBLICATIONS

K. Shenai et al., "Optimum Semiconductors for High-Power Electronics", IEEE Transactions on Electron Devices, vol. 36, No. 9, pp. 1811-1823, Sep. 1989.
(Continued)

*Primary Examiner* — William Coleman
(74) *Attorney, Agent, or Firm* — Rabin & Berdo, P.C.

(57) ABSTRACT

In a semiconductor device, an interlayer insulating film electrically insulating a gate electrode and a source electrode has a structure in which a BPSG film and a NSG film are sequentially stacked. Further, the interlayer insulating film has a structure in which the BPSG film, the NSG film, and a SiN film are sequentially stacked, or a structure in which the BPSG film, the SiN film, and the NSG film are sequentially stacked. Such a structure enables the reliability of the semiconductor device in which a pin-shaped electrode is bonded by solder to be improved.

8 Claims, 4 Drawing Sheets

(51) Int. Cl.
*H01L 29/10* (2006.01)
*H01L 29/78* (2006.01)
*H01L 21/04* (2006.01)
*H01L 29/66* (2006.01)

(52) U.S. Cl.
CPC .... *H01L 29/1608* (2013.01); *H01L 29/66068* (2013.01); *H01L 29/7811* (2013.01)

(56) References Cited

U.S. PATENT DOCUMENTS

| | | |
|---|---|---|
| 2015/0115285 A1 | 4/2015 | Kinoshita et al. |
| 2017/0110544 A1* | 4/2017 | Hoshi ................. H01L 29/1608 |
| 2017/0141222 A1* | 5/2017 | Harada ............... H01L 29/1095 |

FOREIGN PATENT DOCUMENTS

| | | |
|---|---|---|
| JP | 2012-191010 A | 10/2012 |
| JP | 2013-232560 A | 11/2013 |
| JP | 2013-232564 A | 11/2013 |
| JP | 2014-099444 A | 5/2014 |

OTHER PUBLICATIONS

B. Jayant Baliga et al., "Silicon Carbide Power Devices", USA, World Scientific Publishing Co., pp. 61-69, Mar. 30, 2006.

* cited by examiner

SEMICONDUCTOR DEVICE AND METHOD OF MANUFACTURING SEMICONDUCTOR DEVICE

CROSS REFERENCE TO RELATED APPLICATIONS

This is a continuation application of International Application PCT/JP2016/073367 filed on Aug. 8, 2016 which claims priority from a Japanese Patent Application No. 2015-184249 filed on Sep. 17, 2015, the contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Silicon (Si) has been used as a constituent material of power semiconductor devices that control high voltage and/or large current. There are several types of power semiconductor devices such as bipolar transistors, insulated gate bipolar transistors (IGBTs), metal oxide semiconductor field effect transistors (MOSFETs), etc. These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

Nonetheless, there is a strong demand in the market for a large-current, high-speed power semiconductor device. Thus, IGBTs and power MOSFETs have been intensively developed and improved, and the performance of power devices has substantially reached the theoretical limit determined by the material. In terms of power semiconductor devices, semiconductor materials replacing silicon have been investigated and silicon carbide (SiC) has been focused on as a semiconductor material enabling production (manufacture) of a next-generation power semiconductor device having low ON voltage, high-speed characteristics, and high-temperature characteristics (see, for example, K. Shenai, et al, "Optimum Semiconductors for High-Power Electronics", IEEE Transactions on Electron Devices, September 1989, Vol. 36, No. 9, pp. 1811-1823).

Silicon carbide is chemically a very stable semiconductor material, has a wide bandgap of 3 eV, and can be used very stably as a semiconductor even at high temperatures. Silicon carbide has a critical electric field strength that is ten times that of silicon or greater, and is expected to be a semiconductor material that can sufficiently reduce ON-resistance. These merits of silicon carbide are common to other semiconductor materials having a bandgap greater than silicon (hereinafter, wide bandgap semiconductor), such as gallium nitride (GaN). Thus, a high-voltage semiconductor device having low resistance can be achieved by using a wide bandgap semiconductor material (see, for example, B. Jayant Baliga, et al, "Silicon Carbide Power Devices", USA, World Scientific Publishing Co., 2006.03.30, p. 61).

With such high-voltage semiconductor devices using silicon carbide, when used in an inverter, the extent to which occurring loss is reduced, the carrier frequency may be used for frequency applications 10 times higher than that of a conventional semiconductor device using silicon. Further, when a semiconductor device is used for a high frequency application, generated heat increases the chip temperature, affecting the reliability of the semiconductor device. In particular, a bonding wire is bonded to a front electrode exposed on a substrate front surface side. The bonding wire is a wiring member to carry the potential of the front electrode to the outside and when the semiconductor device is used at high temperatures, adhesion of the front electrode and the bonding wire decreases, affecting reliability of the semiconductor device.

Further, other than bonding wire, there is a technique of using a plate conductor member as a wiring member to carry the potential of the front electrode to the outside (for example, refer to Japanese Laid-Open Patent Publication No. 2014-99444).

In one conventional silicon carbide semiconductor device, a pin-shaped electrode is bonded to the front electrode by solder. FIG. 4 is a cross-sectional view of a structure of a silicon carbide semiconductor device of a related art. On a surface of an $n^+$-type silicon carbide substrate 1, an n-type silicon carbide epitaxial layer 2 is deposited, and a $p^+$-type region 10 is provided in plural in a surface of the n-type silicon carbide epitaxial layer 2. On surfaces of the $p^+$-type regions 10, a p-type silicon carbide epitaxial layer 11 is provided. In the p-type silicon carbide epitaxial layer 11 on the n-type silicon carbide epitaxial layer 2, an n-type well region 12 is provided where the $p^+$-type region 10 is not provided. In the p-type silicon carbide epitaxial layer 11, $n^+$-type source regions 4 and $p^{++}$-type contact regions 5 are provided.

On a surface of the p-type silicon carbide epitaxial layer 11, a gate electrode 7 is provided between the $n^+$-type source region 4 and the n-type well region 12, via a gate insulating film 6. On a top of the gate electrode 7, a Phospho Silicate Glass (PSG) film 14 is selectively provided as an interlayer insulating film 13. On surfaces of the $n^+$-type source regions 4 and the $p^{++}$-type contact regions 5, a source electrode 8 is provided. On a top of the source electrode 8, a protective film 15 is selectively provided and at portions where the protective film 15 is not provided, a plating film 16 is provided.

A second protective film 17 is provided so as to cover a portion where the plating film 16 and the protective film 15 are adjacent to each other. Solder 19 is provided connecting a pin-shaped electrode 18 to the plating film 16 portion, the pin-shaped electrode 18 is connected to an external signal. On a rear surface side of the $n^+$-type silicon carbide substrate 1, a drain electrode 9 is provided.

In the MOSFET of the structure depicted in FIG. 4, when voltage less than a gate threshold is applied to the gate electrode 7 in a state where positive voltage is applied to the drain electrode 9 with respect to the source electrode 8, a pn junction of the p-type silicon carbide epitaxial layer 11 and the n-type well region 12 is reverse biased, the breakdown voltage of the active region is secured and current does not flow. On the other hand, when voltage equal to or higher than the gate threshold is applied to the gate electrode 7, an inversion layer is formed at the surface of the p-type silicon carbide epitaxial layer 11 directly beneath the gate electrode 7 whereby current flows, enabling switching operation of the MOSFET to be performed by the voltage applied to the gate electrode 7.

SUMMARY OF THE INVENTION

According to one aspect of the present invention, a semiconductor device includes a first-conductivity-type wide bandgap semiconductor substrate including a semiconductor material having a bandgap wider than that of silicon; a first-conductivity-type wide bandgap semiconductor deposition layer deposited on a front surface of the first-conductivity-type wide bandgap semiconductor substrate and having an impurity concentration lower than that of the first-conductivity-type wide bandgap semiconductor substrate; a second-conductivity-type semiconductor region selectively provided in a first side of the first-conductivity-type wide bandgap semiconductor deposition layer opposite a second side of the first-conductivity-type wide bandgap semiconductor deposition layer facing the first-conductivity-type wide bandgap semiconductor substrate; a second-conductivity-type wide bandgap semiconductor layer provided on surfaces of the first-conductivity-type wide bandgap semiconductor deposition layer and the second-conductivity-type semiconductor region and including a semiconductor material having a bandgap wider than that of silicon; a first first-conductivity-type region selectively provided on the first-conductivity-type wide bandgap semiconductor deposition layer and in the second-conductivity-type wide bandgap semiconductor layer; a second first-conductivity-type region selectively provided in the second-conductivity-type wide bandgap semiconductor layer; a gate electrode provided on the second first-conductivity-type region and the second-conductivity-type wide bandgap semiconductor layer, via a gate insulating film; a source electrode in contact with the second-conductivity-type wide bandgap semiconductor layer and the second first-conductivity-type region; an interlayer insulating film covering the gate electrode; a drain electrode provided on a rear surface of the first-conductivity-type wide bandgap semiconductor substrate; a plating film selectively provided on the source electrode; and a pin-shaped electrode connected to the plating film via solder, the pin-shaped electrode taking out an external signal. The interlayer insulating film has a structure in which a first insulating film and a second insulating film are sequentially stacked, the second insulating film is softer than the first insulating film.

In the semiconductor device, the first insulating film is one of a BPSG film and a PSG film, and the second insulating film is a NSG film.

In the semiconductor device, the interlayer insulating film has a structure in which a BPSG film or a PSG film, NSG film and SiN film, or, a BPSG film or a PSG film, SiN film and NSG film are sequentially stacked.

In the semiconductor device, the interlayer insulating film has structure in which a BPSG film or a PSG film, a NSG film and SiN film are sequentially stacked, the SiN film covers entirely a surface of the BPSG film or the PSG film and the NSG film, and ends of the BPSG film or the PSG film and the NSG film exposed in a contact hole are covered by the SiN film.

In the semiconductor device, a portion of the source electrode in contact with the interlayer insulating film includes TiN.

The semiconductor device includes a first protective film selectively provided on the source electrode; and a second protective film covering the plating film and the first protective film. The plating film is selectively provided on the source electrode at portions where the first protective film is not provided.

A method of manufacturing a semiconductor device includes forming a first-conductivity-type wide bandgap semiconductor deposition layer on a front surface of a first-conductivity-type wide bandgap semiconductor substrate including a semiconductor material having a bandgap wider than that of silicon, the first-conductivity-type wide bandgap semiconductor deposition layer having an impurity concentration lower than that of the first-conductivity-type wide bandgap semiconductor substrate; selectively forming a second-conductivity-type semiconductor region in a surface layer of the first-conductivity-type wide bandgap semiconductor deposition layer; forming a second-conductivity-type wide bandgap semiconductor layer on a surface of the first-conductivity-type wide bandgap semiconductor deposition layer, the second-conductivity-type wide bandgap semiconductor layer including a semiconductor material having a bandgap wider than that of silicon; selectively forming a first first-conductivity-type region in the second-conductivity-type wide bandgap semiconductor layer so as to be on the first-conductivity-type wide bandgap semiconductor deposition layer; selectively forming a second first-conductivity-type region in the second-conductivity-type wide bandgap semiconductor layer; forming a gate electrode on the second first-conductivity-type region and the second-conductivity-type wide bandgap semiconductor layer, via a gate insulating film; forming a source electrode in contact with the second-conductivity-type wide bandgap semiconductor layer and the second first-conductivity-type region; forming an interlayer insulating film covering the gate electrode; forming a drain electrode on a rear surface of the first-conductivity-type wide bandgap semiconductor substrate; selectively forming a plating film on the source electrode; and forming a pin-shaped electrode connected to the plating film via solder, the pin-shaped electrode taking out an external signal. The interlayer insulating film is formed by sequentially stacking a first insulating film and a second insulating film that is soft compared to the first insulating film.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
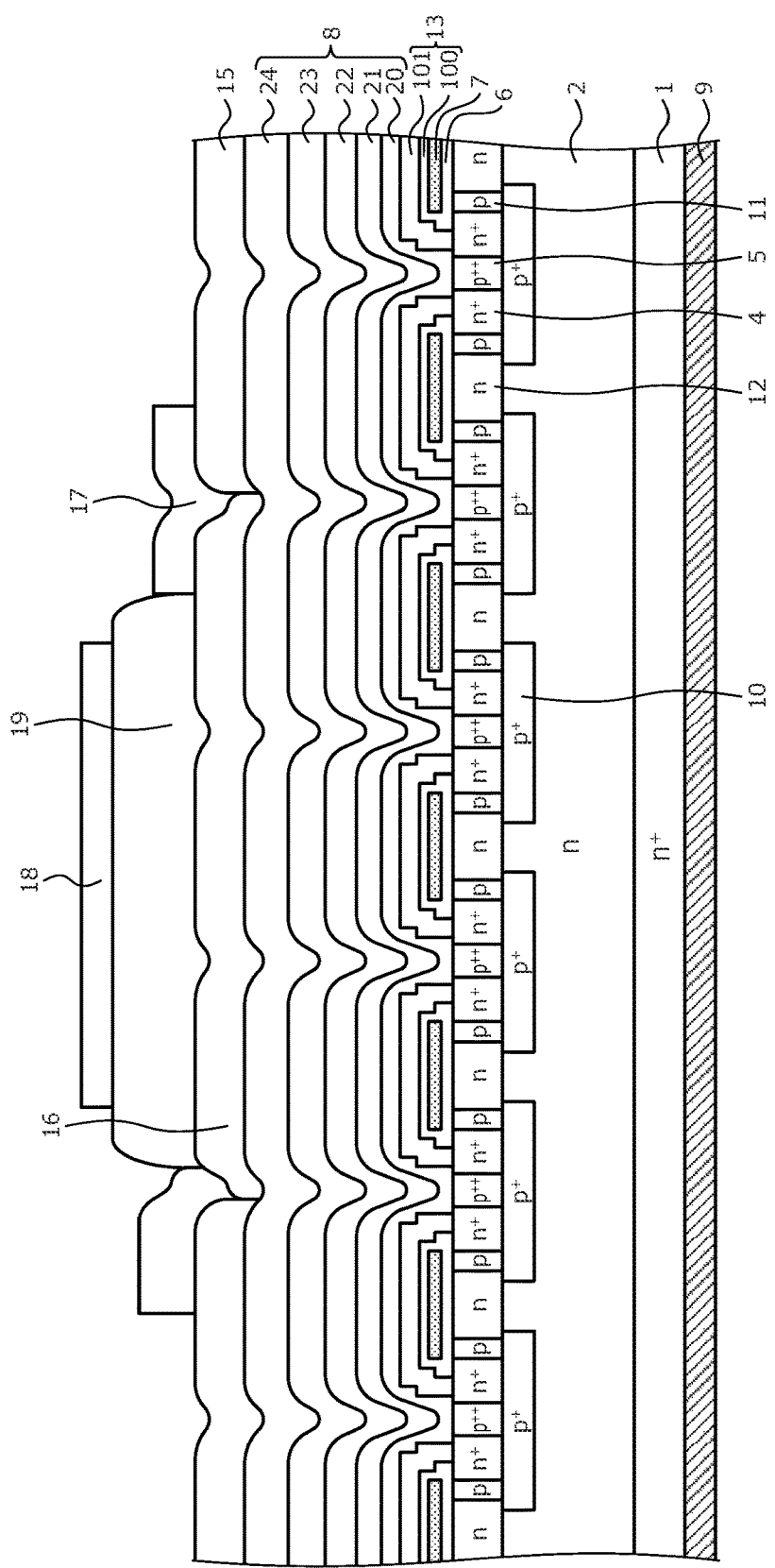
FIG. 1 is a cross-sectional view of a silicon carbide semiconductor device according to a first embodiment.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

First, problems related to the convention structure will be discussed. With a conventional structure, coverage (step portion coverage) of the interlayer insulating film 13 is poor and in the surface of the interlayer insulating film 13, a step portion is generated consequent to underlying layers not being level. As a result, when the pin-shaped electrode 18 is solder bonded to the source electrode 8, stress concentrates and is placed on the step portion of the interlayer insulating film 13. Here, the step portion of the interlayer insulating film 13 results from the interlayer insulating film 13 covering the gate electrode 7, and is a height of the interlayer insulating film 13 from a silicon carbide semiconductor base, which is the n+-type silicon carbide substrate 1 and the n-type silicon carbide epitaxial layer 2 combined. Further, at the time of solder bonding of the pin-shaped electrode 18 and/or at the time of switching of the semiconductor device, the temperature difference of the solder 19 and periphery becomes large and near an end portion of the solder 19, particularly, at a triple junction portion where the plating film 16, the protective film 15, and the source electrode 8 are in contact with each other, stress resulting from differences in thermal expansion concentrates. Consequent to the concentration of stress in this manner, characteristics of the semiconductor device degrade and reliability decreases. In a worst case, the interlayer insulating film 13 cracks, the gate electrode 7 and the source electrode 8 short, and semiconductor device fails.

Further, consequent to the adverse effects of gas and penetration of pretreatment liquid when the plating film 16 is formed, characteristics of the semiconductor device degrade such as variation of the threshold voltage whereby reliability decreases.

A semiconductor device according to the present invention is configured using a wide bandgap semiconductor. In a first embodiment, a MOSFET will be described as an example of a silicon carbide semiconductor device produced using, for example, silicon carbide (SiC) as a wide bandgap semiconductor. FIG. 1 is a cross-sectional view of a silicon carbide semiconductor device according to the first embodiment. FIG. 1 depicts a state of an active region.

As depicted in FIG. 1, in the silicon carbide semiconductor device according to the first embodiment, the n-type silicon carbide epitaxial layer (first-conductivity-type wide bandgap semiconductor deposition layer) 2 is deposited on a first main surface (front surface) of the n+-type silicon carbide substrate (first-conductivity-type wide bandgap semiconductor substrate) 1.

The n+-type silicon carbide substrate 1 is a silicon carbide single crystal substrate doped with, for example, nitrogen (N). The n-type silicon carbide epitaxial layer 2 is a low-concentration n-type drift layer doped with, for example, nitrogen and has an impurity concentration that is lower than that of the n+-type silicon carbide substrate 1. Hereinafter, the n+-type silicon carbide substrate 1 and the n-type silicon carbide epitaxial layer 2 combined will be regarded as a silicon carbide semiconductor base.

On a front surface side of the silicon carbide semiconductor base, a MOS gate (insulated gate constituting a metal oxide film semiconductor) structure (element structure) is formed. In particular, in a surface layer on a front surface side of the n-type silicon carbide epitaxial layer 2 (front surface side of the silicon carbide semiconductor base) opposite a rear surface side facing the n+-type silicon carbide substrate 1, the p+-type region (second-conductivity-type semiconductor region) 10 functioning as a p-type base layer is selectively provided.

On surfaces of the n-type silicon carbide epitaxial layer 2 and the p+-type regions 10, the p-type silicon carbide epitaxial layer (second-conductivity-type wide bandgap semiconductor layer) 11 is deposited. Further, in a portion of the p-type silicon carbide epitaxial layer 11 on the n-type silicon carbide epitaxial layer 2, the n-type well region (first first-conductivity-type region) 12 is provided penetrating the p-type silicon carbide epitaxial layer 11 in a depth direction and reaching the n-type silicon carbide epitaxial layer 2. The n-type well region 12 constitutes the n-type silicon carbide epitaxial layer 2 and a drift region.

In portions of the p-type silicon carbide epitaxial layer 11 facing the p+-type regions 10 in the depth direction, the n+-type source region (second first-conductivity-type region) 4 is selectively provided away from the n-type well region 12. Further, the p++-type contact region (second-conductivity-type region) 5 having an impurity concentration higher than that of the p-type silicon carbide epitaxial layer 11 is selectively provided in the p-type silicon carbide epitaxial layer 11, between the n+-type source regions 4.

The interlayer insulating film 13 is provided on the front surface side of the silicon carbide semiconductor base overall so as to cover the gate electrode 7. The gate electrode 7 may be provided on a surface of the n-type well region 12 via the gate insulating film 6.

A borophosphosilicate glass (BPSG) film 100 and a none-doped silicate glass (NSG) film 101 are stacked as the interlayer insulating film 13.

Here, the BPSG film 100 has a property of high adhesiveness with the gate electrode 7. Further, the BPSG film 100 has a property enabling reflow for planarization at a lower temperature than the PSG film 14. Therefore, the BPSG film 100 may be preferably provided on a surface of the gate electrode 7. Further, the NSG film 101 is soft as compared to the BPSG film 100 and thus, has a property of dissipating stress caused by differences in thermal expansion and stress arising with solder bonding and concentrating at the step portion of the interlayer insulating film 13.

The source electrode 8 is provided in contact with the n+-type source regions 4 and the p++-type contact regions 5 via contact holes opened in the interlayer insulating film 13 and is electrically connected to the n+-type source regions 4 and the p++-type contact regions 5.

A first TiN (titanium nitride) film 20, a first Ti (titanium) film 21, a second TiN film 22, a second Ti film 23, an Al—Si film 24 are stacked as the source electrode 8. The Al—Si film 24, for example, is an aluminum film containing silicon at a rate of 1%.

The Al—Si film 24 may be an Al—Si—Cu film or an Al—Cu film. The Al—Si—Cu film is an aluminum film containing silicon and copper. The Al—Cu film is an aluminum film containing copper.

Further, on the rear surface of the silicon carbide semiconductor base, the drain electrode 9 is provided. On the source electrode 8, the protective film 15 is selectively provided and on the source electrode 8 where the protective film 15 is not provided, the plating film 16 is provided. The protective film 15 has a function of protecting the front surface of the semiconductor device. Further, when the plating film 16 is formed, the protective film 15 has a function of preventing plating of the plating film 16 from flowing outside. The protective film 15 has a further function of protecting an edge termination structure region (not depicted) surrounding a periphery of the active region. Here, the active region is a region through which current flows when the semiconductor device is in an ON state. The edge termination structure region is a region provided so as to surround the perimeter of the active region. The edge termination structure region mitigates the electric field on the substrate front surface side of a drift layer and maintains the breakdown voltage.

The second protective film 17 is selectively provided so as to cover a portion where the plating film 16 and the protective film 15 are in contact with each other. The second protective film 17 covers a space between the plating film 16 and the protective film 15 and, for example, has a function of preventing the solder 19 and the like from entering the base side. The second protective film 17 functions as a mask when the solder 19 is formed. The second protective film 17 may cover the entire surface of the protective film 15. The pin-shaped electrode 18, which is a wiring member that carries the potential of the source electrode 8 to the outside, is provided connected to the plating film 16 portion via the solder 19. The pin-shaped electrode 18 has a pin shape and is bonded in an upright position to the source electrode 8.

The method of manufacturing a semiconductor device according to the first embodiment will be described, taking as an example, a case in which 1200V MOSFET is produced. First, for example, the n$^+$-type silicon carbide substrate 1 doped with nitrogen to have an impurity concentration of about $2\times10^{19}$ cm$^{-3}$ is prepared. The n$^+$-type silicon carbide substrate 1 may have a main surface that is, for example, a (000-1) face having a 4-degree off angle in a <11-20> direction.

On the (000-1) face of the n$^+$-type silicon carbide substrate 1, the n-type silicon carbide epitaxial layer 2 having a thickness of 10 μm and doped with nitrogen to have an impurity concentration of about $1.0\times10^{16}$ cm$^{-3}$ is formed by epitaxial growth.

On a surface of the n-type silicon carbide epitaxial layer 2, a mask having desired openings is formed by photolithography using, for example, a resist. Further, a p-type impurity, for example, aluminum atoms, is ion implanted using the resist mask as a mask. As a result, in portions of a surface region of the n-type silicon carbide epitaxial layer 2, the p$^+$-type regions 10 are formed. Next, the mask used at the time of ion implantation for forming the p$^+$-type regions 10 is removed.

Next, on the surface of the n-type silicon carbide epitaxial layer 2, the p-type silicon carbide epitaxial layer 11 having a thickness of, for example, 0.5 μm is formed by epitaxial growth. Here, for example, the epitaxial growth may be performed so that the impurity concentration of the p-type silicon carbide epitaxial layer 11 becomes $2.0\times10^{16}$ cm$^{-3}$.

On a surface of the p-type silicon carbide epitaxial layer 11, a mask having desired openings is formed by photolithography using, for example, a resist. Subsequently, an n-type impurity, for example, nitrogen, is ion implanted using this resist mask as a mask. As a result, the n$^+$-type source region 4 is formed in portions of the surface region of the p-type silicon carbide epitaxial layer 11. Next, the mask used at the time of ion implantation for forming the n$^+$-type source regions 4 is removed.

Next, on the surface of the p-type silicon carbide epitaxial layer 11, a mask having desired openings is formed by photolithography using, for example, a resist. Subsequently, a p-type impurity, for example, aluminum, is ion implanted using this resist mask as a mask. As a result, the p$^{++}$-type contact region 5 is formed in portions of the surface region of the p-type silicon carbide epitaxial layer 11. Next, the mask used at the time of ion implantation for forming the p$^{++}$-type contact regions 5 is removed.

Next, on the surface of the p-type silicon carbide epitaxial layer 11, a mask having desired openings is formed by photolithography using, for example, a resist. Subsequently, an n-type impurity, for example, nitrogen, is ion implanted using this resist mask as a mask. As a result, the n-type well region 12 is formed in portions of the surface region of the p-type silicon carbide epitaxial layer 11. Next, the mask used at the time of ion implantation for forming the n-type well region 12 is removed.

Next, heat treatment (annealing) for activating the n$^+$-type source regions 4, the p$^{++}$-type contact regions 5, and the n-type well regions 12 is performed. Here, the temperature and duration of the heat treatment may be 1620 degrees C. and 2 minutes, respectively.

The sequence in which the n$^+$-type source regions 4, the p$^{++}$-type contact regions 5, and the n-type well regions 12 are formed may be varied.

Next, the front surface side of the silicon carbide semiconductor base is subject to thermal oxidation and the gate insulating film 6 having a thickness of 100 nm is formed. The thermal oxidation may be performed by heat treatment in a mixed atmosphere of oxygen (O$_2$) and hydrogen (H$_2$) at a temperature of 1000 degrees C. As a result, regions formed on surfaces of the p-type silicon carbide epitaxial layer 11 and the n-type silicon carbide epitaxial layer 2 are covered by the gate insulating film 6.

Next, on the gate insulating film 6, a polycrystalline silicon layer doped with, for example, phosphorus (P), is formed as the gate electrode 7. Next, the polycrystalline silicon layer is patterned and selectively removed, leaving the polycrystalline silicon layer on a portion of the p-type silicon carbide epitaxial layer 11 between the n$^+$-type source region 4 and the n-type well region 12. Here, the polycrystalline silicon layer may be left on the n-type well region 12. The polycrystalline silicon layer that remains becomes the gate electrode 7.

The BPSG film 100 is formed as the interlayer insulating film 13 and so as to cover the gate electrode 7. The BPSG film 100, for example, is formed by depositing BPSG to a thickness of 1.0 μm. Next, a reflow process is performed to planarize the BPSG film 100. After the reflow process, the BPSG film 100 is selectively removed, forming contact holes and exposing the n+-type source regions 4 and the p++-type contact regions 5. Next, on the BPSG film 100, the NSG film 101, which is not doped, is formed. A thickness of the NSG film 101 is, for example, about 0.1 μm.

Next, the interlayer insulating film 13 is patterned and selectively removed, forming contact holes and exposing the n$^+$-type source regions 4 and the p$^{++}$-type contact regions 5. Further, after the reflow process of the BPSG film 100, on the BPSG film 100, the NSG film 101, which is not doped, may be formed and the interlayer insulating film 13 may be patterned and selectively removed to form contact holes and expose the n$^+$-type source regions 4 and the p$^{++}$-type contact regions 5. In this case, processes for forming contact holes may be reduced.

Next, the first TiN film 20, the first Ti film 21, the second TiN film 22, the second Ti film 23, and the Al—Si film 24 are formed as the source electrode 8. For example, the first TiN film 20 is formed by sputtering and the first Ti film 21 is formed on the first TiN film 20 by sputtering. Next, the second TiN film 22 is formed on the first Ti film 21 by sputtering. Next, the second Ti film 23 is formed on the second TiN film 22 by sputtering and the Al—Si film 24 is formed on the second Ti film 23. In place of the Al—Si film 24, an Al—Si—Cu film or an Al—Cu film may be used.

Next, on a surface (rear surface of the silicon carbide semiconductor base) of the $n^+$-type silicon carbide substrate 1, for example, a nickel film is deposited as the drain electrode 9. Subsequently, for example, heat treatment at a temperature of 970 degrees C. is performed, forming an ohmic contact of the $n^+$-type silicon carbide substrate 1 and the drain electrode 9.

Next, on a surface of the nickel film, for example, titanium, nickel (Ni), and gold (Au) are sequentially deposited as the drain electrode 9. Next, the protective film 15 of the front surface side of the silicon carbide semiconductor base is selectively formed on the source electrode 8.

Next, using the protective film 15 as a mask, the plating film 16 is selectively formed on the source electrode 8, at portions where the protective film 15 is not present. As a result, the plating film 16 is formed on the source electrode 8 without plating flowing into the edge termination structure region. Next, for example, a polymer resin or the like is used, and the second protective film 17 is selectively formed so as to cover a portion where the plating film 16 and the protective film 15 are adjacent to each other.

Next, the protective film 15 and the second protective film 17 are used as a mask when applying solder and the pin-shaped electrode 18 is formed on the plating film 16 via the solder 19, thus, completing the MOSFET depicted in FIG. 1.

As described, according to the first embodiment, the interlayer insulating film has the 2-layer structure of the BPSG film/the NSG film, enabling stress to be dispersed by the NSG film. In particular, adhesiveness with the gate electrode is increased by the BPSG film. In addition, stress arising with solder bonding and concentrating at the step portion of the interlayer insulating film 13 and stress caused by differences in thermal expansion may be dissipated by the NSG film.

Thus, according to the first embodiment, degradation of the characteristics of the semiconductor device may be suppressed, suppressing decreases in the reliability of the semiconductor device. Further, although the BPSG film may crack consequent to the stress at the time of solder bonding and the stress caused by differences in thermal expansion, even in such a case, insulation of the gate electrode and the source electrode is maintained by the soft, crack-resistant NSG film whereby the semiconductor device may be prevented from failing consequent to the gate electrode and the source electrode short circuiting.

Further, the interlayer insulating film has the 2-layer structure of the BPSG film/the NSG film whereby airtightness is improved, suppressing degradation in characteristics consequent to the effects of gas, penetration of pretreatment liquid when the plating film is formed, etc. Thus, decreases in the reliability of the semiconductor device are suppressed. Further, rather than a bonding wire or a plate-shaped terminal, a pin-shaped electrode is adopted as the wiring member to carry out the potential of the source electrode thereby enabling the pin-shaped electrode to be bonded to the source electrode in an upright position and take out an external signal from a direction orthogonal to the chip main surface. Therefore, a region for arranging an electrode pad, which is necessary when taking out external signals from a direction horizontal to the chip main surface in a case where a wire or a plate-shape terminal is used as the wiring member, becomes unnecessary, enabling the size of the semiconductor device to be reduced. Further, since the pin-shaped electrode is bonded to the source electrode by solder, even when the semiconductor device is used at high temperatures, adhesion of the source electrode and the pin-shaped electrode does not decrease and reliability is not affected.

Figure 2:
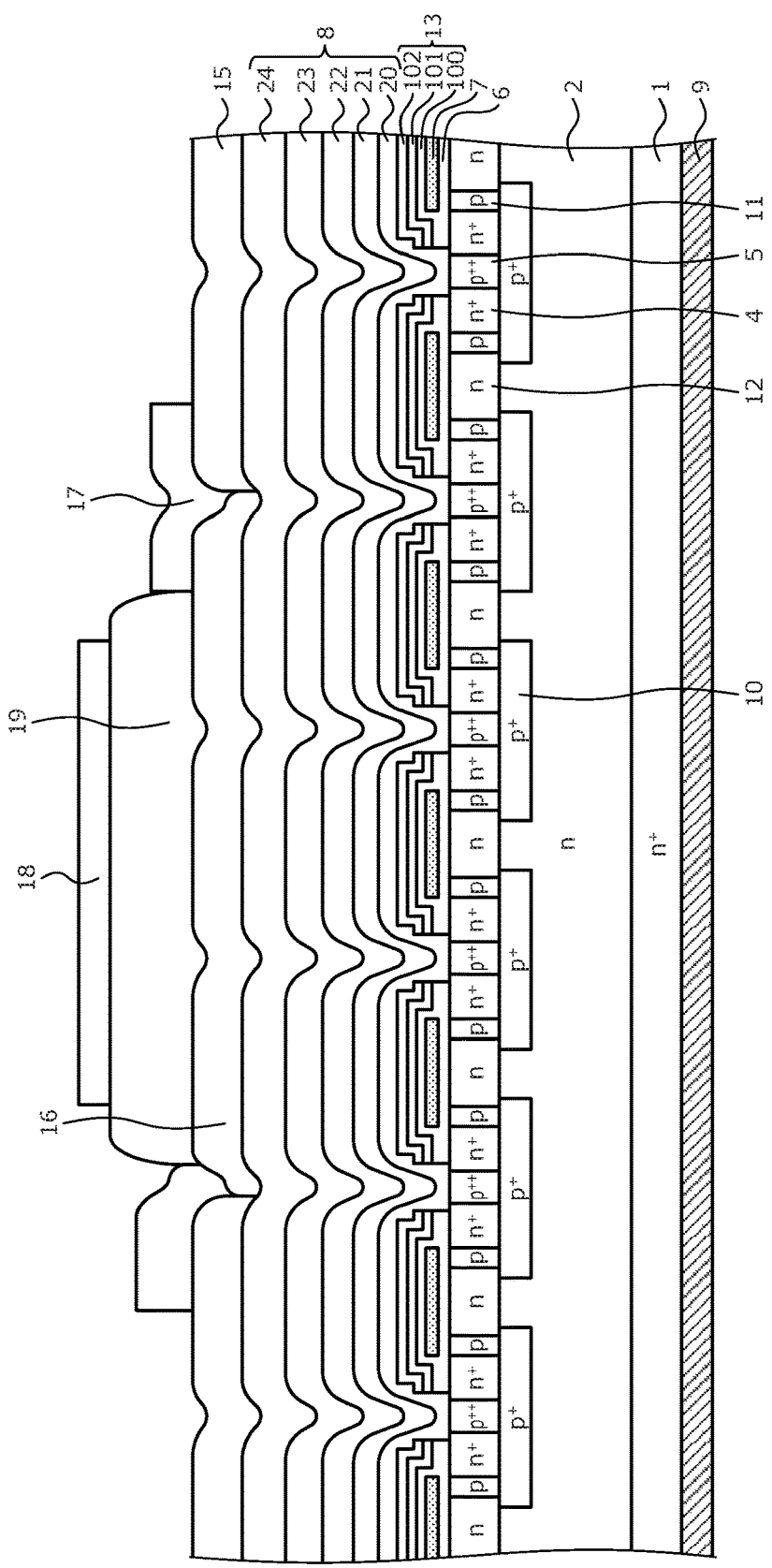
FIG. 2 is a cross-sectional view of the silicon carbide semiconductor device according to a second embodiment.

FIG. 2 is a cross-sectional view of the silicon carbide semiconductor device according to a second embodiment. The semiconductor device according to the second embodiment differs from the semiconductor device according to the first embodiment in that a 3-layered structure is adopted in which a silicon nitride (SiN) film 102 is further stacked to the interlayer insulating film 13, the NSG film 101, or between the BPSG film 100 and the NSG film 101.

The interlayer insulating film 13 includes stacked sequentially from the gate electrode 7, the BPSG film 100, the NSG film 101, and the SiN film 102. Further, the interlayer insulating film 13 may include stacked sequentially from the gate electrode 7, the BPSG film 100, the SiN film 102, and the NSG film 101.

Here, the SiN film 102 has a property of low water absorption, enabling penetration of water to the gate electrode 7 side to be prevented. Further, the SiN film 102 has a property of high adhesiveness with the first TiN film 20 of the source electrode 8, making peeling from the source electrode 8 difficult.

The method of manufacturing a silicon carbide semiconductor device according to the second embodiment will be described. First, similar to the first embodiment, processes from the formation of the n-type silicon carbide epitaxial layer 2 to the formation of the gate electrode 7 are sequentially performed.

Next, similar to the first embodiment, the BPSG film 100 and the NSG film 101 are formed as the interlayer insulating film 13. Next, the SiN film 102 is formed on the NSG film 101. A thickness of the SiN film 102 is, for example, about 0.1 μm. Further, the sequence in which the NSG film 101 and the SiN film 102 are formed may be interchanged.

Further, the thickness of the BPSG film 100 and the thickness of the NSG film 101 may be made thinner than in a case of a 2-layered structure. For example, the interlayer insulating film 13 of the 3-layered structure may have about the same thickness as the interlayer insulating film 13 of a 2-layer structure. As a result, the step portion of the interlayer insulating film 13 becomes about the same as in a case of the 2-layer structure and the step portion of the interlayer insulating film 13 may be prevented from becoming larger than in the case of the 2-layered structure whereby poor coverage of the source electrode 8 may be prevented.

Next, the BPSG film 100, the NSG film 101, and the SiN film 102 are selectively removed, forming contact holes and exposing the $n^+$-type source regions 4 and the $p^{++}$-type contact regions 5.

Thereafter, similar to the first embodiment, the process of forming the source electrode 8 and subsequent processes are sequentially performed whereby the MOSFET depicted in FIG. 2 is completed.

As described, according to the second embodiment, the silicon carbide semiconductor device and the method of manufacturing a silicon carbide semiconductor device achieve effects identical to those obtained by the silicon carbide semiconductor device and the method of manufacturing a silicon carbide semiconductor device, according to the first embodiment.

Further, according to the second embodiment, the silicon carbide semiconductor device and the method of manufacturing a silicon carbide semiconductor device suppress a penetration of water to the interlayer insulating film by a stacking of the SiN film on the interlayer insulating film. Thus, degradation of the characteristics of the semiconductor device may be prevented to a greater extent as compared to a case in which the interlayer insulating film is a 2-layered structure. Further, among the BPSG film, the NSG film and the SiN film of the interlayer insulating film, the SiN film is stacked uppermost on the interlayer insulating film, enabling adhesiveness with the TiN film of the source electrode to be increased.

Figure 3:
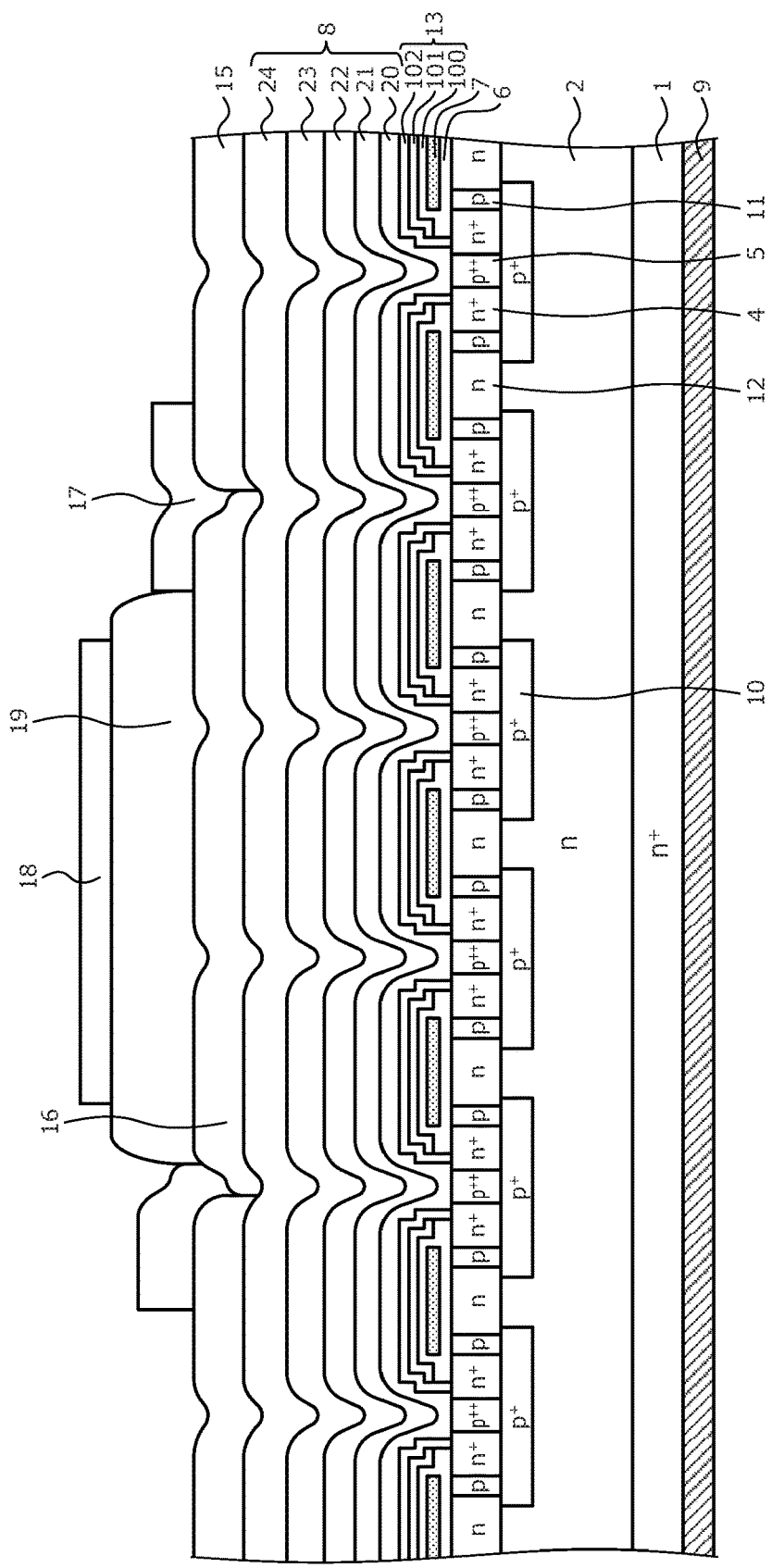
FIG. 3 is a cross-sectional view of the silicon carbide semiconductor device according to a third embodiment.
Figure 4:
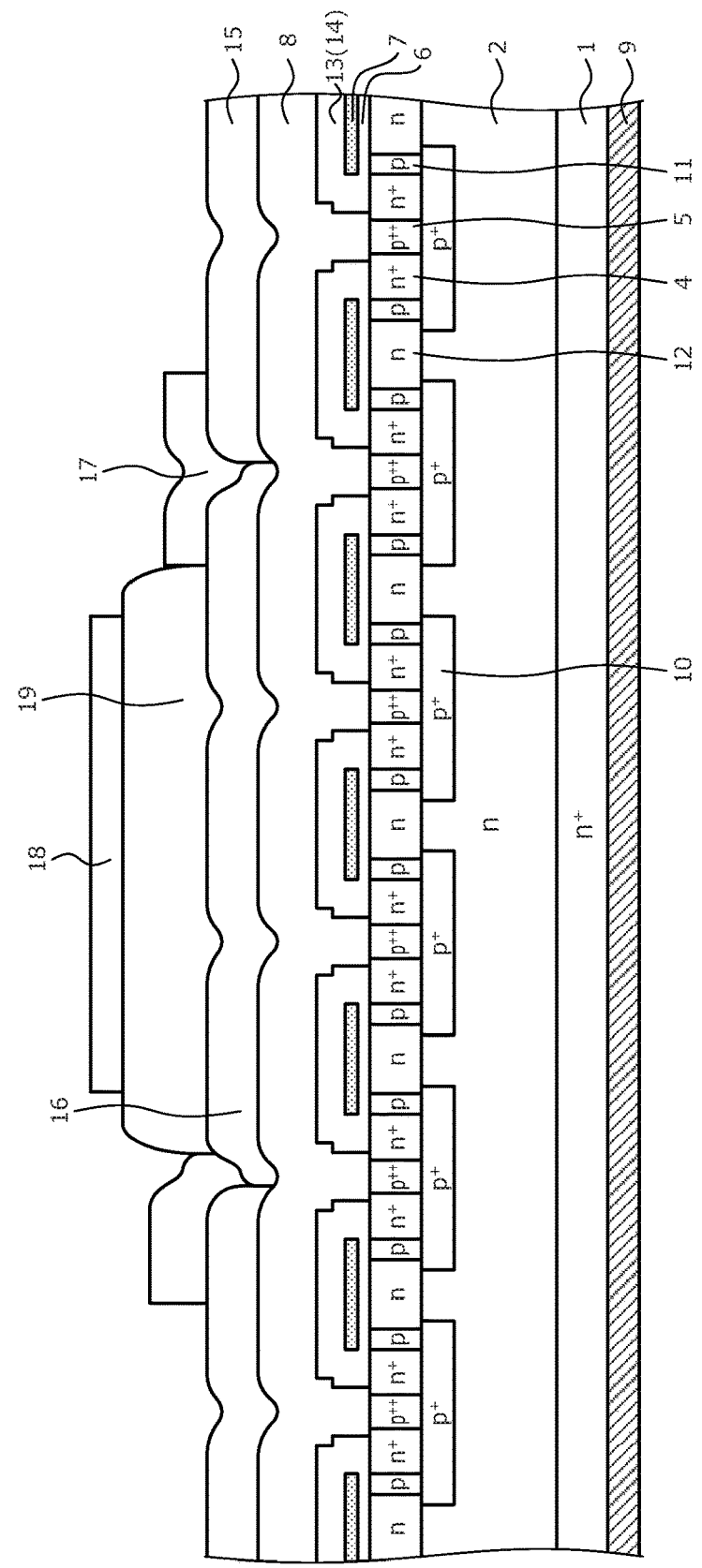
FIG. 4 is a cross-sectional view of a structure of a silicon carbide semiconductor device of a related art.

FIG. 3 is a cross-sectional view of the silicon carbide semiconductor device according to a third embodiment. The semiconductor device according to the third embodiment differs from the semiconductor device according to the second embodiment in that the SiN film 102 covers surfaces of the NSG film 101 and the BPSG film 100 entirely whereby ends of the BPSG film 100 and the NSG film 101 of the interlayer insulating film 13, exposed in the contact holes are covered by the SiN film 102.

The method of manufacturing a silicon carbide semiconductor device according to the third embodiment will be described. First, similar to the first embodiment, process from the formation of the n-type silicon carbide epitaxial layer 2 to the formation of the gate electrode 7 are sequentially performed.

Next, similar to the first embodiment, the BPSG film 100 and the NSG film 101 are formed as the interlayer insulating film 13. Next, the BPSG film 100 and the NSG film 101 are selectively removed, forming contact holes and exposing the n$^+$-type source regions 4 and the p$^{++}$-type contact regions 5. Next, the SiN film 102 is formed on the NSG film 101. The thickness of the SiN film 102 is, for example, about 0.1 μm. Next, the SiN film 102 is selectively removed, again exposing the n$^+$-type source regions 4 and the p$^{++}$-type contact regions 5 in contact holes. By the processes up to here, a configuration is obtained in which the SiN film 102 covers surfaces of the NSG film 101 and the BPSG film 100 entirely, and ends of the BPSG film 100 and the NSG film 101 of the interlayer insulating film 13, exposed in contact holes are covered by the SiN film 102.

Thereafter, similar to the first embodiment, the process of forming the source electrode 8 and subsequent processes are sequentially performed whereby the MOSFET depicted in FIG. 3 is completed.

As described, according to the third embodiment, the silicon carbide semiconductor device and the method of manufacturing a silicon carbide semiconductor device achieve effects identical to those obtained by the silicon carbide semiconductor device and the method of manufacturing a silicon carbide semiconductor device, according to the first and second embodiments.

Further, according to the third embodiment, the silicon carbide semiconductor device and the method of manufacturing a silicon carbide semiconductor device enable a penetration of water to the interlayer insulating film to be prevented by covering ends of the BPSG film and the NSG film exposed in the contact holes by the SiN film.

In the embodiment, although a MOSFET has been described as an example, without limitation hereto, the present invention is applicable to semiconductor devices of various configurations such as MOS-type semiconductor devices like IGBTs, semiconductor devices of a configuration in which stress concentrates at an element structure consequent to a step portion of the interlayer insulating film, and the like. Further, in the embodiment, although a case in which silicon carbide is used as a wide bandgap semiconductor is described as an example, similar effects are obtained when a wide bandgap semiconductor other than silicon carbide is used, such as gallium nitride (GaN). In the embodiment, although the first conductivity type is assumed to be an n-type and the second conductivity type is assumed to be a p-type, the present invention is similarly implemented when the first conductivity type is a p-type and the second conductivity type is an n-type.

According to the embodiments, the interlayer insulating film has a 2-layered structure of the BPSG film/the NSG film, enabling stress to be dispersed by the 2 layers. In particular, adhesiveness with the gate electrode is increased by the BPSG film. In addition, stress at the step portion is dissipated by the NSG film.

Thus, by mitigating the stress placed on the step portion of the interlayer insulating film consequent to bonding the pin-shaped electrode to the source electrode, degradation of the characteristics of the semiconductor device is suppressed whereby decreases in the reliability of the semiconductor device are suppressed. Further, stress placed on the step portion of the interlayer insulating film is mitigated whereby cracking of the interlayer insulating film is prevented, enabling failure of the semiconductor device consequent to the gate electrode and the source electrode shorting to be suppressed.

Further, the interlayer insulating film has a 2-layered structure or a 3-layered structure whereby air-tightness is improved, suppressing degradation of characteristics consequent to the effects of gas and penetration of pretreatment liquid when the plating film is formed. Thus, decreases in the reliability of the semiconductor device are suppressed. Furthermore, rather than a bonding wire or a plate-shaped terminal, the pin-shaped electrode is bonded to the source electrode by solder and therefore, even when the semiconductor device is used at high temperatures, adhesion of the source electrode and the pin-shaped electrode does not decrease and the reliability of the semiconductor device is not adversely affected.

The SiN film is stacked on the interlayer insulating film, enabling a penetration of water to the gate electrode side to be suppressed and decreases in the characteristics of the semiconductor device to be prevented. Further, among the BPSG film, the NSG film and the SiN film of the interlayer insulating film, the SiN film is stacked uppermost on the interlayer insulating film, enabling adhesiveness with the TiN film of the source electrode to be increased.

Ends of the BPSG film and the NSG film are covered by the SiN film, enabling a penetration of water to the interlayer insulating film to be suppressed.

The semiconductor device and the method of manufacturing a semiconductor device according to the present invention achieve an effect in that a semiconductor device may be provided that has favorable characteristics and suppresses decreases in characteristics of the semiconductor device.

As described, the semiconductor device according to the present invention is useful for high-voltage semiconductor devices used in power converting equipment and power supply devices such as in various industrial machines, and is particularly suitable for silicon carbide semiconductor devices using a pin-shaped electrode as a wiring member to carry the potential of the front electrode to the outside.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
   a first-conductivity-type wide bandgap semiconductor substrate including a semiconductor material having a bandgap wider than that of silicon, the first-conductivity-type wide bandgap semiconductor substrate having a front surface and a rear surface;
   a first-conductivity-type wide bandgap semiconductor deposition layer deposited on the front surface of the first-conductivity-type wide bandgap semiconductor substrate and having an impurity concentration lower than that of the first-conductivity-type wide bandgap semiconductor substrate, the first-conductivity-type wide bandgap semiconductor deposition layer having a first side and a second side opposite to the first side, the second side facing the first-conductivity-type wide bandgap semiconductor substrate;
   a second-conductivity-type semiconductor region selectively provided in the first side of the first-conductivity-type wide bandgap semiconductor deposition layer;
   a second-conductivity-type wide bandgap semiconductor layer provided on surfaces of the first-conductivity-type wide bandgap semiconductor deposition layer and the second-conductivity-type semiconductor region and including a semiconductor material having a bandgap wider than that of silicon;
   a first first-conductivity-type region selectively provided in the second-conductivity-type wide bandgap semiconductor layer on the first-conductivity-type wide bandgap semiconductor deposition layer;
   a second first-conductivity-type region selectively provided in the second-conductivity-type wide bandgap semiconductor layer;
   a gate insulating film and a gate electrode on the gate insulating film provided on the second first-conductivity-type region and the second-conductivity-type wide bandgap semiconductor layer;
   an interlayer insulating film covering the gate electrode, the interlayer insulating film including a first insulating film on the gate electrode and a second insulating film on the first insulating film, a second material of the second insulating film being softer than a first material of the first insulating film;
   a source electrode in contact with the second-conductivity-type wide bandgap semiconductor layer and the second first-conductivity-type region;
   a drain electrode provided on the rear surface of the first-conductivity-type wide bandgap semiconductor substrate;
   a plating film selectively provided on the source electrode; and
   a pin-shaped electrode for an external connection, connected to the plating film via solder.

2. The semiconductor device according to claim 1, wherein the first insulating film is one of a BPSG film and a PSG film, and the second insulating film is a NSG film.

3. The semiconductor device according to claim 1, wherein the interlayer insulating film further includes a third insulating film on the second insulating film, the first to third insulating films being comprised of a BPSG film or a PSG film, a NSG film and a SiN film, respectively.

4. The semiconductor device according to claim 1, wherein the interlayer insulating film further includes a third insulating film on the second insulating film, the first to third insulating films being comprised of a BPSG film or a PSG film, a SiN film and a NSG film, respectively.

5. The semiconductor device according to claim 1, wherein
   the source electrode is disposed in a contact hole formed in the interlayer insulating film,
   the interlayer insulating film further includes a third insulating film on the second insulating film, and
   the first to third insulating films are comprised of a BPSG film or a PSG film, a NSG film, and SiN film, respectively, the third insulating film covering an entire surface of the second film, ends of the first and second films exposed in the contact hole being covered by the third insulating film.

6. The semiconductor device according to claim 1, wherein a portion of the source electrode in contact with the interlayer insulating film includes TiN.

7. The semiconductor device according to claim 1, comprising:
   a first protective film selectively provided on the source electrode; and
   a second protective film covering the plating film and the first protective film, wherein
   the plating film is selectively provided on the source electrode at portions where the first protective film is not provided.

8. A method of manufacturing a semiconductor device, the method comprising:
   forming a first-conductivity-type wide bandgap semiconductor deposition layer on a front surface of a first-conductivity-type wide bandgap semiconductor substrate, the first-conductivity-type wide bandgap semiconductor substrate including a semiconductor material having a bandgap wider than that of silicon, the first-conductivity-type wide bandgap semiconductor deposition layer having an impurity concentration lower than that of the first-conductivity-type wide bandgap semiconductor substrate;
   selectively forming a second-conductivity-type semiconductor region in a surface layer of the first-conductivity-type wide bandgap semiconductor deposition layer;
   forming a second-conductivity-type wide bandgap semiconductor layer on a surface of the first-conductivity-type wide bandgap semiconductor deposition layer, the second-conductivity-type wide bandgap semiconductor layer including a semiconductor material having a bandgap wider than that of silicon;
   selectively forming a first first-conductivity-type region in the second-conductivity-type wide bandgap semiconductor layer so as to be on the first-conductivity-type wide bandgap semiconductor deposition layer;
   selectively forming a second first-conductivity-type region in the second-conductivity-type wide bandgap semiconductor layer;
   forming, on the second first-conductivity-type region and the second-conductivity-type wide bandgap semiconductor layer, a gate insulating film and a gate electrode on the gate insulating film;
   forming a source electrode in contact with the second-conductivity-type wide bandgap semiconductor layer and the second first-conductivity-type region;
   forming an interlayer insulating film covering the gate electrode, the interlayer insulating film including a first insulating film on the gate electrode and a second insulating film on the first insulating film, a material of the second insulating film being softer than that of the first insulating film forming a drain electrode on a rear surface of the first-conductivity-type wide bandgap semiconductor substrate;

selectively forming a plating film on the source electrode; and forming a pin-shaped electrode for an external connection, the pin-shaped electrode being connected to the plating film via solder.

* * * * *